(12) United States Patent
Bayan et al.

(10) Patent No.: US 6,452,255 B1
(45) Date of Patent: Sep. 17, 2002

(54) LOW INDUCTANCE LEADLESS PACKAGE

(75) Inventors: Jaime Bayan, Palo Alto, CA (US); Peter Howard Spalding, Cupertino, CA (US); Harry Cheng Hong Kam, Melaka (MY); Ah Lek Hu, Melaka (MY); Sharon Mei Wan Ko, Melaka (MY); Santhiran Nadarajah, Malacca (MY); Aik Seng Kang, Melaka (MY); Yin Yen Bong, Melaka (MY)

(73) Assignee: National Semiconductor, Corp., Santa Clara, CA (US)

( * ) Notice: Subject to any disclaimer, the term of this patent is extended or adjusted under 35 U.S.C. 154(b) by 0 days.

(21) Appl. No.: 09/528,662

(22) Filed: Mar. 20, 2000

(51) Int. Cl.[7] .................................. H01L 23/495
(52) U.S. Cl. .................. 257/666; 257/678; 257/687; 257/701; 438/123
(58) Field of Search .................. 257/678, 687, 257/701, 704, 666; 438/123

(56) References Cited

U.S. PATENT DOCUMENTS

| | | | |
|---|---|---|---|
| 5,157,475 A | 10/1992 | Yamaguchi | 257/784 |
| 5,157,480 A | 10/1992 | McShane et al. | 257/693 |
| 5,367,196 A | 11/1994 | Mahulikar et al. | 257/787 |
| 5,454,905 A | 10/1995 | Fogelson | 29/827 |
| 5,494,207 A * | 2/1996 | Asanasavest | 228/110.1 |
| 5,508,556 A * | 4/1996 | Lin | 257/691 |
| 5,521,429 A | 5/1996 | Aono et al. | 257/676 |
| 5,596,231 A | 1/1997 | Combs | 257/776 |
| 5,623,123 A * | 4/1997 | Umehara | 174/52.2 |
| 5,656,550 A * | 8/1997 | Tsuji et al. | 438/123 |
| 5,741,729 A * | 4/1998 | Selna | 438/125 |

(List continued on next page.)

FOREIGN PATENT DOCUMENTS

| | | |
|---|---|---|
| GB | 2 059 157 A | 4/1981 |
| JP | 03108745 A * | 5/1991 |

OTHER PUBLICATIONS

Leadless Leadframe Package (LLP), National Semiconductor Application Note 1187, Sep. 2000.

Primary Examiner—Eddie Lee
Assistant Examiner—Chris C. Chu
(74) Attorney, Agent, or Firm—Beyer Weaver & Thomas, LLP

(57) ABSTRACT

A variety of leadless packaging arrangements and methods of packaging integrated circuits in leadless packages that are arranged to have relatively low inductance are disclosed. In one aspect, a leadless semiconductor package is described having an exposed die pad and a plurality of exposed contacts that are formed from a common substrate material. The die attach pad, however, is thinned relative to at least a portion of the contacts. A die is mounted on the thinned die attach pad and wire bonded to the contacts. Since the die attach pad is lower than the contact surface being wire bonded to, the length of the bonding wires can be relatively reduced, thereby reducing inductance of the device. A plastic cap is molded over the die and the contacts thereby encapsulating the bonding wires while leaving the bottom surface of the contacts exposed. In some embodiments, the die is arranged to overhangs beyond the die attach pad towards the contacts. In other embodiments, a portion of at least some of the contacts are thinned to a thickness substantially similar to the die attach pad to form contact shelves. The die is then mounted such that it bridges the die attach pad to the contact shelves. In some of the embodiments, reverse wire bonding is used to further shorten the bonding wires. The described devices are packaged in bulk on a conductive substrate panel.

11 Claims, 8 Drawing Sheets

U.S. PATENT DOCUMENTS

| | | | |
|---|---|---|---|
| 5,844,315 A | 12/1998 | Melton et al. | 257/738 |
| 5,854,511 A | 12/1998 | Shin et al. | 257/713 |
| 5,866,948 A * | 2/1999 | Murakami et al. | 257/778 |
| 5,981,314 A * | 11/1999 | Glenn et al. | 438/127 |
| 5,990,545 A | 11/1999 | Schueller et al. | 257/697 |
| 6,013,946 A | 1/2000 | Lee et al. | 257/684 |
| 6,060,774 A * | 5/2000 | Terui | 257/692 |
| 6,060,778 A * | 5/2000 | Jeong et al. | 257/710 |
| 6,093,960 A | 7/2000 | Tao et al. | 257/706 |
| 6,130,473 A | 10/2000 | Mostafazadeh et al. | 257/666 |
| 6,133,070 A * | 10/2000 | Yagi et al. | 438/121 |
| 6,177,288 B1 | 1/2001 | Takiar | 438/15 |
| 6,188,130 B1 | 2/2001 | Ramirez et al. | 257/706 |
| 6,201,292 B1 * | 3/2001 | Yagi et al. | 257/666 |
| 6,215,179 B1 | 4/2001 | Ohgiyama | 257/676 |

\* cited by examiner

LOW INDUCTANCE LEADLESS PACKAGE

CROSS REFERENCE TO RELATED APPLICATIONS

This application is related to commonly assigned U.S. patent application Ser. Nos. 09/528,540, 09/528,658, 09/528,539, and 09/616,228 filed concurrently herewith, each of which are incorporated herein by reference.

BACKGROUND OF THE INVENTION

The present invention relates generally to the bulk packaging of integrated circuits. More particularly, the invention relates to leadless packaging designs and processes that inherently have relatively lower inductance.

A leadless leadframe package (LLP) is a relatively new integrated circuit package design that contemplates the use of a metal (typically copper) leadframe type substrate structure in the formation of a chip scale package (CSP). As illustrated in FIG. 1, in typical leadless leadframe packages, a copper leadframe strip or panel 101 is patterned (typically by stamping or etching) to define a plurality of arrays 103 of chip substrate features. Each chip substrate feature includes a die attach pad 107 and a plurality of contacts 109 disposed about their associated die attach pad 107. Very fine tie bars 111 are used to support the die attach pads 107 and contacts 109.

During assembly, dice are attached to the respective die attach pads and conventional wire bonding is used to electrically couple bond pads on each die to their associated contacts 109 on the leadframe strip 101. After the wire bonding, a plastic cap is molded over the top surface of the each array 103 of wire bonded dice. The dice are then singulated and tested using conventional sawing and testing techniques.

FIG. 2 illustrates a typical resulting leadless leadframe package. The die attach pad 107 supports a die 120 which is electrically connected to its associated contacts 109 by bonding wires 122. A plastic cap 125 encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip can then be surface mounted on a printed circuit board or other substrate using conventional techniques.

Although leadless leadframe packaging has proven to be a cost effective packaging arrangement, there are continuing efforts to further improve the package structure and processing to improve the performance of the resultant devices. One persistent issue in packaging generally is the need and desire to provide packaging designs that facilitate relatively low inductance devices. Accordingly leadless packaging arrangements that have generally lower inductance would be desirable.

SUMMARY OF THE INVENTION

To achieve the foregoing and other objects and according to the purpose of the present invention, a variety of leadless packaging arrangements and methods of packaging integrated circuits in leadless packages are disclosed. In one aspect, a leadless semiconductor package is described having an exposed die pad and a plurality of exposed contacts that are formed from a common substrate material. The die attach pad, however, is thinned relative to at least a portion of the contacts. A die is mounted on the die attach pad and wire bonded to the contacts. Since the die attach pad is lower than the contact surface being wire bonded to, the length of the bonding wires can be relatively reduced, thereby reducing inductance of the device. A plastic cap is molded over the die and the contacts thereby encapsulating the bonding wires while leaving the bottom surface of the contacts exposed.

In some embodiments, the die is arranged to overhangs beyond the die attach pad towards the contacts. In other embodiments, a portion of at least some of the contacts are thinned to a thickness substantially similar to the die attach pad to form contact shelves. The die is then mounted such that it bridges the die attach pad to the contact shelves. These arrangements can also be used to relatively shorten the bonding wires. In some of the embodiments, reverse wire bonding is used to further shorten the bonding wires.

The described devices are packaged in bulk on a conductive substrate panel having at least one matrix of device areas defined thereon. Each device area includes a plurality of contacts and a thinned die attach pad. Individual caps are molded over each matrix of device areas prior to singulation of the devices.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE INVENTION

A number of improved leadless package designs are described below. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

One of the sources of inductance in any packaging arrangement that utilizes wire bonding to electrically couple the die to associated contacts (such as the leadless packaging arrangements described in the background) are the bonding wires themselves. One of the important variables in bonding wires that has a significant impact on the resulting inductance is the length of the bonding wires. Therefore, one theme of the various embodiments of the present invention is that efforts are made to design the package in a way that permits the use of generally shorter bonding wires.

Figure 1A:
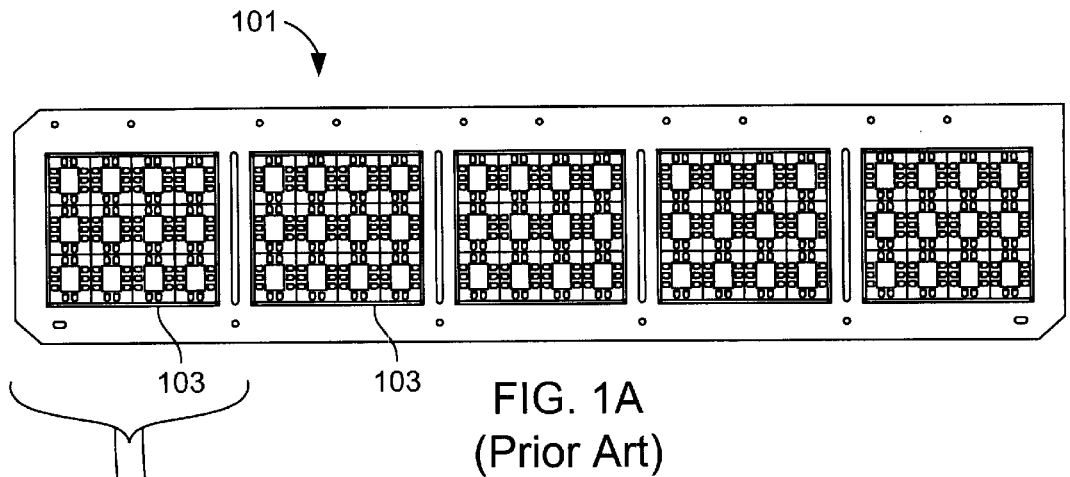
FIGS. 1A–1C are diagrammatic top views of a conventional lead frame strip suitable for use in forming leadless leadframe packages.
Figure 1B:
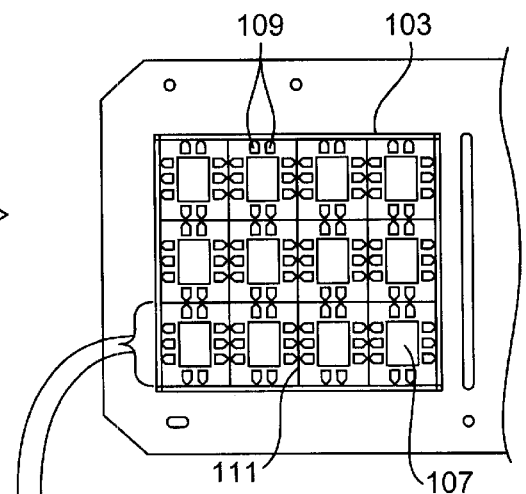
Figure 1C:
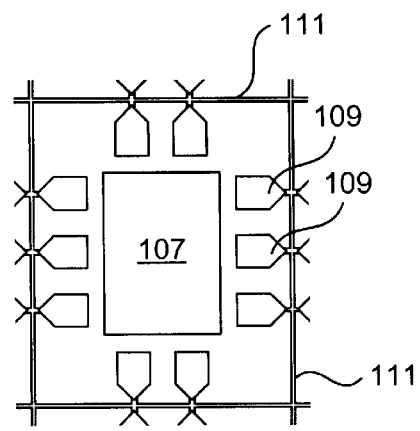
Figure 2:
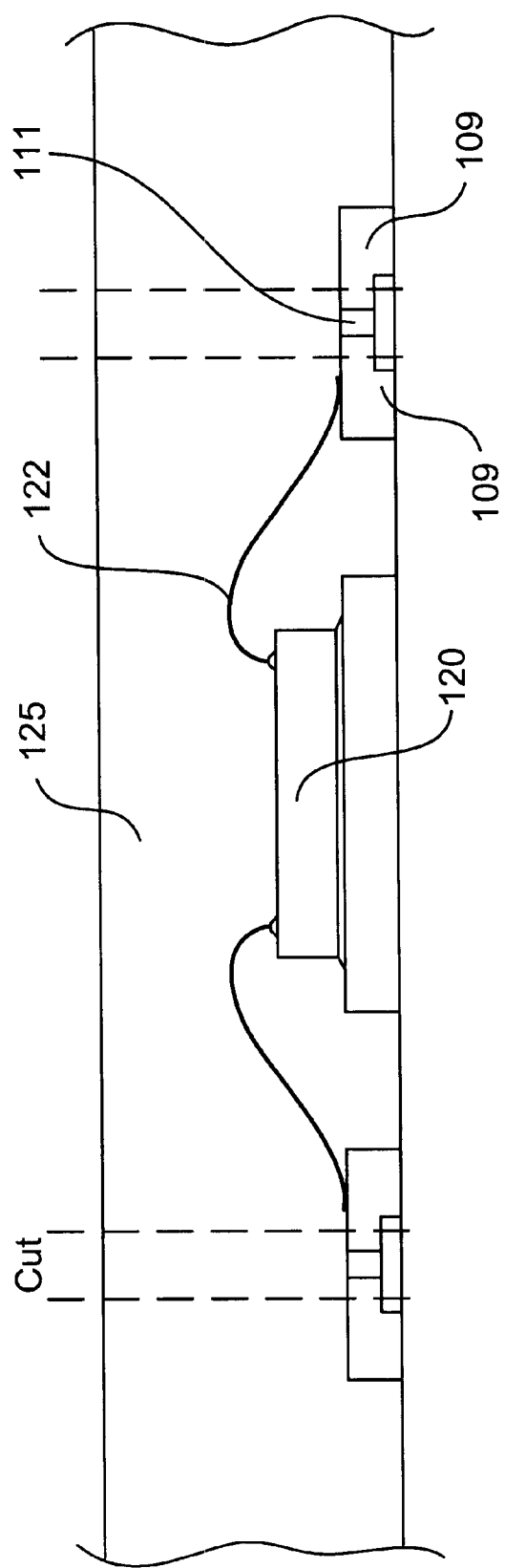
FIG. 2 is a diagrammatic cross sectional side view of a conventional leadless leadframe package.
Figure 3A:
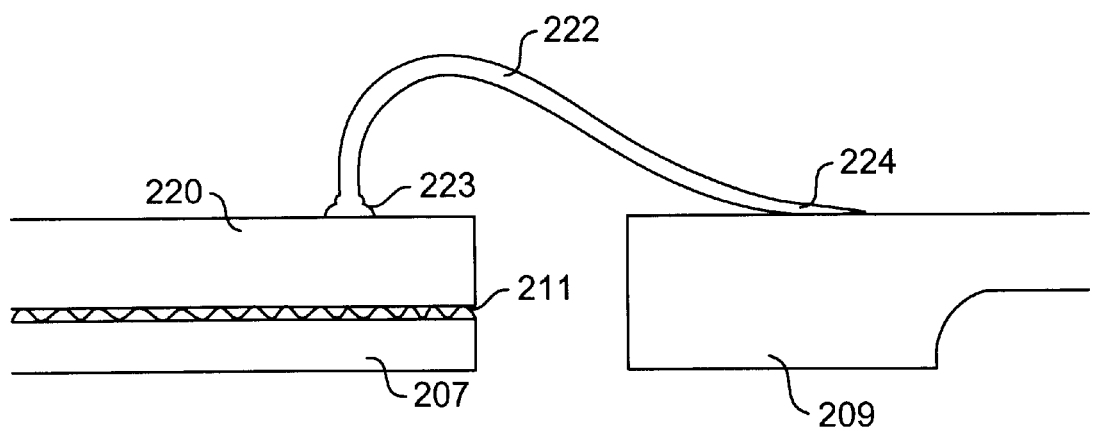
FIG. 3(a) is a diagrammatic cross sectional partial side view of a low inductance leadless package design illustrating the region of a bonding wire in accordance with one embodiment of the present invention.
Figure 3B:
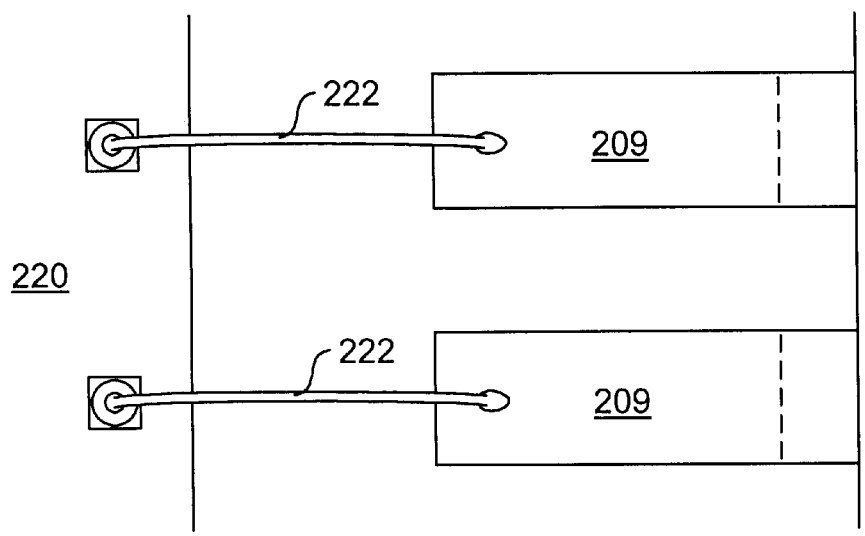
FIG. 3(b) is diagrammatic partial top view of the bonding wire region illustrated in FIG. 3(a).

Referring initially to FIGS. 3(a) and 3(b), a first embodiment of the present invention will be described. In this embodiment, the leadless package may (but need not) be produced quite similarly to the conventional leadless package illustrated in FIG. 2. However, the die attach pad 207 is thinned before die 220 is attached thereto. Thus, the thickness of the die attach pad is reduced relative to the thickness of the contacts 209. With this arrangement, the die sits lower in the package and the bonding wires 222 can be shortened accordingly.

In the embodiment shown in FIG. 3(a), the die attach pad region 207 of the substrate 200 is etched sufficiently such that the thickness of the die attach pad, the adhesive 211 used to bond the die to the die attach pad and the die 220 itself have a combined thickness approximately equal to the original thickness of the leadframe. Thus, they have a combined thickness approximately equal to the thickness of the contact 209. However, it should be appreciated that this is not in any way a requirement. Rather any reduction in the thickness of the die attach pad 207 will tend to reduce the required length of the bonding wire 222 and generally, the thinner the die attach pad 207, the shorter the bonding wire 222 may be for a given die size.

As will be appreciated by those familiar with wire bonding generally, a first end of the bonding wire is typically "ball" bonded to its associated surface (e.g., a bond pad on die 220 in FIG. 3(a)), which forms a ball bond 223. The second end of the bonding wire is typically attached to a second surface (e.g., the contact 209 in FIG. 3(a)), using a bond commonly referred to as a "stitch" or "wedge" bond 224. The bonding wire leaving ball bond 223 tends to rise substantially perpendicularly away from the surface of the die 220, while the bonding wire tends to approach the stitch bond 224 in a manner that is closer to parallel with the surface of contact 209. Thus a "loop" is formed by the bonding wire. As is well known to those skilled in the art, state of the art wire bonding machines permit a great deal of control over the height of the loop. However, the loop generally cannot be eliminated and in small devices, the loop height generally has a significant effect on the overall length of the bonding wires used (as well as potentially on the overall package thickness). Since the loop will necessarily be present and will have the most significant effect on the side of the bonding wire 222 that is ball bonded, the length of the bonding wires in the embodiment illustrated in FIG. 3(a) would be even further reduced if the combined height of the die attach pad 207, the die 220 and the adhesive 211 that bonds the two together is less than the height of the contact 209.

Figure 4:
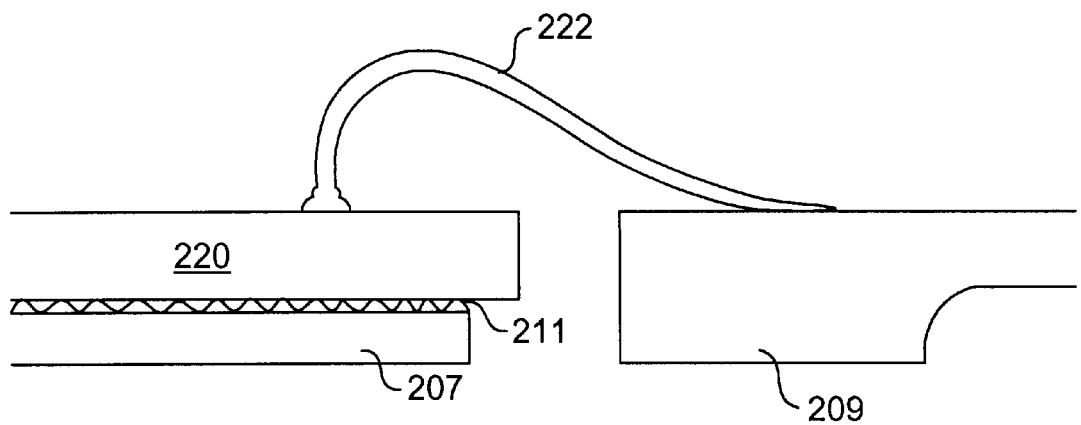
FIG. 4 is a diagrammatic cross sectional partial side view of a low inductance leadless package design illustrating the region of a bonding wire in accordance with a second embodiment of the present invention.

Referring next to FIG. 4, a second embodiment of the present invention will be described. In this embodiment, the die 220 is mounted such that it overhangs the edge of the thinned die attach pad 207. This generally permits the length of the bonding wire 222 to be reduced relative to situations where the die attach pad is positioned the same and the die 220 does not overhang the edge of the die attach pad 207.

As will be appreciated by those skilled in the art, production requirements dictate that there is some minimum distance that the die attach pad 207 must be space away from the contact 209. The minimum distance will depend in large part on the nature of the substrate production process. In the leadless type packaging substrates described in the background (and as will be described in more detail below), the substrate sheet (which may take the form of a copper leadframe type sheet) is typically patterned by stamping, although in some situations they may be formed by chemical etching. In either case, production restraints require that there be some "minimum" distance between any two adjacent components. The appropriate "minimums" are not in any way fixed or absolute. However, as a rule of thumb, when copper is used as the substrate material, it is difficult to get the distance between adjacent components to be significantly smaller than the thickness of the substrate itself in large scale production environments.

Referring back to the embodiment illustrated in FIG. 4, an overhanging die can be used to reduce the distance that a bonding wire 222 must travel to bridge the distance between the bond pads (not shown) and the contact landing 209. In some situations, designing for an overhang can have the side benefit of relaxing design constraints on the spacing between the die attach pad 207 and the contacts 209. Additionally, provided that the overhang is relatively modest, during molding a certain amount of molding material should wrap around the end of the die, which may help hold the cap in place. It is noted that in FIG. 4, the die attach pad 207 is thinned just as in the embodiment shown in FIG. 3(a). It should be apparent that in some implementations, there may be a benefit to overhanging the die even without a thinned die attach pad.

Figure 5:
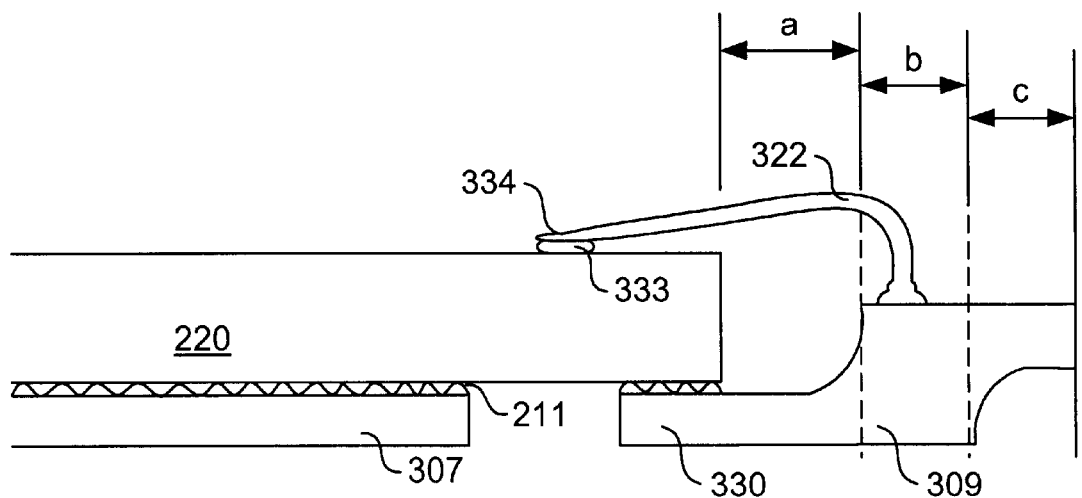
FIG. 5 is a diagrammatic cross sectional partial side view of a low inductance leadless package design illustrating the region of a bonding wire in accordance with a third embodiment of the present invention.

Referring next to FIG. 5, another embodiment of the present invention will be described. In this embodiment, in addition to thinning (e.g. etching) the die attach pad 307, a portion of selected contacts 309 are also thinned substantially the same amount to form a contact shelves 330. The die is then attached to both the die attach pad 307 and the contact shelves 330 using conventional techniques. By way of example, an adhesive epoxy or other suitable die attach material may be dispensed on both the die attach pad 307 and the contact shelves 330 to insure a good bond between the die and the substrate material. It is noted that this arrangement may have the added advantage of providing an additional mechanism for securing the contact 309 in place. Like the embodiment described above with respect to FIG. 4, this permits the gap between the die 220 and the contacts 309 to be reduced thereby permitting the use of shorter bond wires.

Still referring to FIG. 5, another mechanism for shortening the bonding wires 322 which is referred to herein as reverse wire bonding will be described. In many applications, even with die attach pad thinning (with or without contact shelf formation), the top surface of the die 220 will continue to be higher than the top surface of the contact 309. As is well known to those skilled in the art, for a number of reasons, during wire bonding, it is traditional to ball bond to the bond pads on the die and stitch bond to the leads or substrate (such as the contacts 309). One of the reasons for this is that the stitch bonds are less constrained and there is a greater risk of damaging the die. However, there are some techniques available for reverse wire bonding. One such technique is described in U.S. Pat. No. 5,328,079, which is incorporated herein by reference. In this technique, a ball 333 is first formed on the bond pads of the die using a standard ball bonding technique. The ball 333 is terminated and then a reverse wire bond is done with the stitch bond 334 being formed on top of the ball 333.

The described reverse wire bonding can be used in conjunction with any of the described embodiments. It should be apparent that the use of reverse bonding has the potential to help shorten the length of the bonding wires any time the die attach pad 207, 309 is significantly above the height of the contacts 209, 309.

Figure 6A:
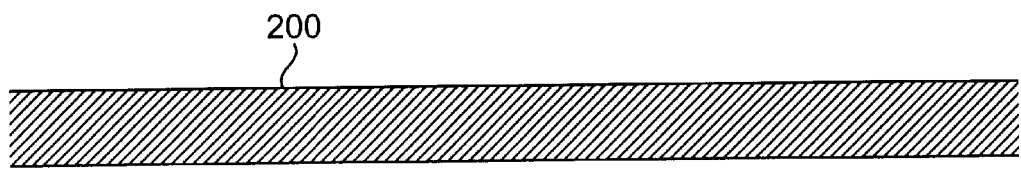
FIGS. 6(a)–6(f) are diagrammatic cross sectional side views illustrating steps involved in packaging an integrated circuit in accordance with one embodiment of the present invention.

Referring next to the sequence of FIGS. 6(a)–6(f), a method of packaging an array of integrated circuits in accordance with various embodiments of the present invention will be described in more detail. A substrate sheet 200 is provided as illustrated in FIG. 6(a). The substrate sheet is formed from a conductive material that is suitable for use as the package contacts. By way of example copper works well and is the material most commonly used in semiconductor packaging applications. However other materials such as aluminum and Alloy 42 may be used instead. The substrate sheet 200 may take any appropriate form factor. Today, much of the packaging handling equipment that is available is designed for handling leadframe strips and therefore, leadframe strips may be used as the substrate sheet. Alternatively, in many respects metal panels (e.g. copper panels) are more appropriate since they will typically have better rigidity and facilitate better space utilization. In the embodiment illustrated in FIG. 7, this type of substrate sheet 200 is used. The panels may take any form although substantially square or rectangular panels are expected to be the most common.

Figure 6B:
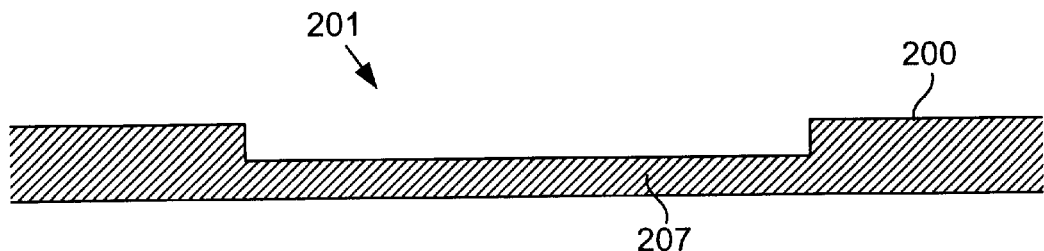
Figure 7:
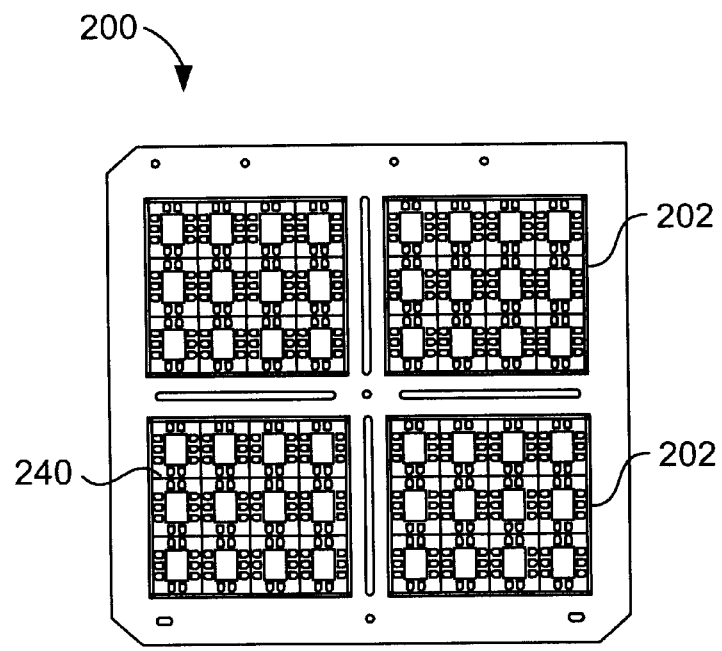
FIG. 7 is a diagrammatic top view of a substrate panel of FIG. 6(c) having a matrix of independent package areas.

Initially, the substrate sheet is patterned to form recesses in the regions of the substrate to be thinned as illustrated in FIG. 6(b). The regions to be thinned will typically include at least the die attach pads 207. In embodiments where it is desirable to thin other features (such as forming the contact shelves "a" as illustrated in FIG. 5), those regions would be thinned as well. The thinning can be accomplished using a variety of conventional etching techniques. In one specific example a photo-lithographic based etch process may be used. However, it should be apparent that the techniques, chemistries and or processes used to etch (or grind or otherwise form) the recesses can be widely varied within the scope of the present invention. In embodiments such as those illustrated in FIG. 5, it might be desirable to thin a rectangular region "b" that includes the contact shelves 309, the die attach pad 307 and any adjoining portions "c" within the rectangle that will eventually be removed. After the panel 200 has initially been patterned to define the thinned regions, it is then fully patterned to form one or more arrays 202 of device areas 204 on the surface of the panel 200. In the embodiment illustrated in FIG. 7, four arrays are illustrated in a panel type substrate panel 200. It should be appreciated that the number of arrays provided in any particular substrate panel and the number of device areas in each array may be very widely varied in accordance with the needs, constraints and optimizations of the particular manufacturing process. By way of example, arrays having from 3 to 20 devices on each side are commonly used, although larger arrays are possible and it is suspected that as technology develops, higher and higher densities having 50 or more devices on a side will be used.

Figure 6C:
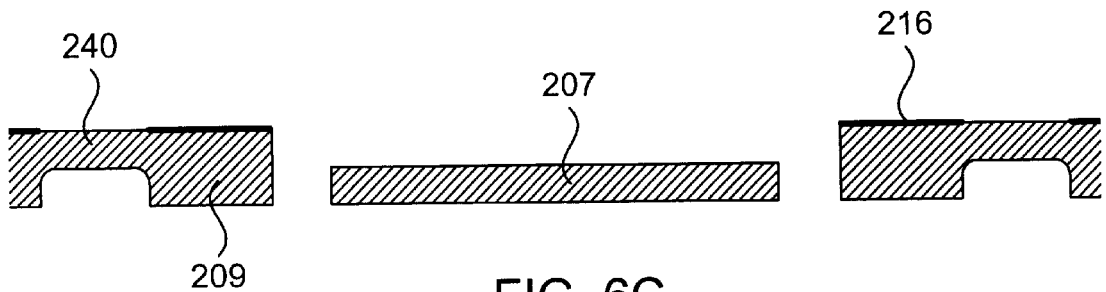
Figure 8:
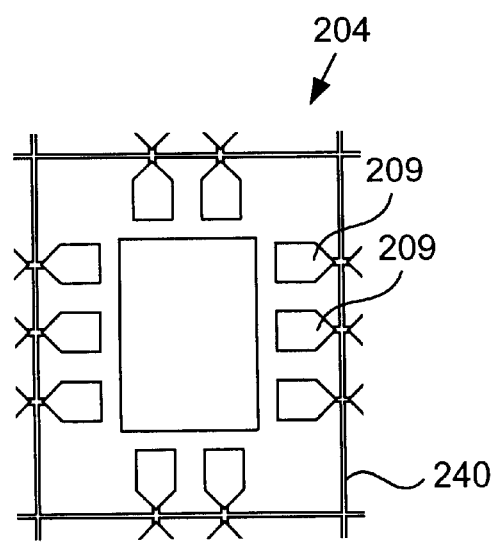
FIG. 8 is a diagrammatic top view the substrate features associated with a single one of the independent package areas illustrated in FIG. 7.
Figure 9A:
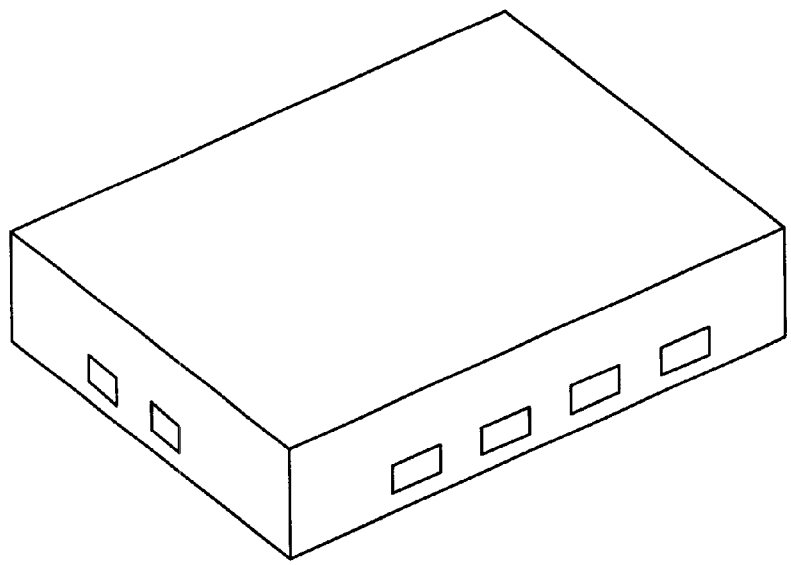
FIGS. 9(a) and 9(b) are perspective top and bottom views respectively of finalized packaged devices in accordance with one embodiment of the present invention.
Figure 9B:
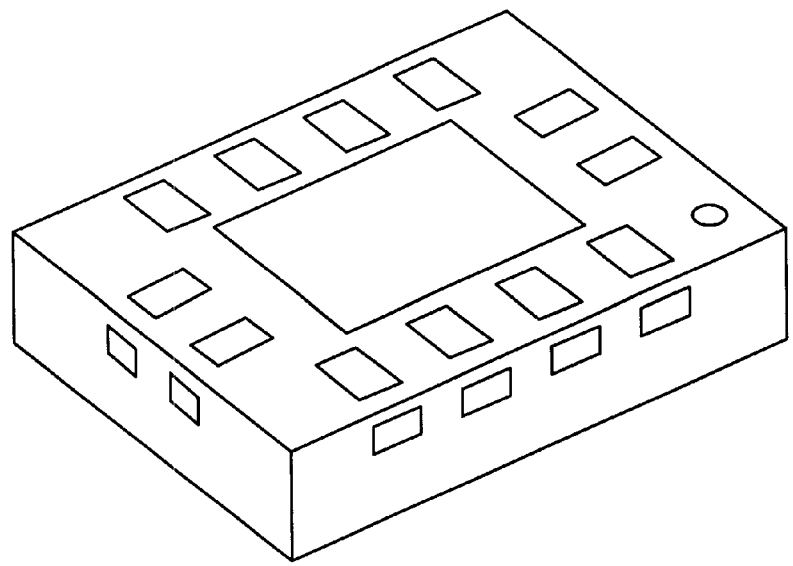

Each device area 204 (illustrated in FIG. 8) has the appropriate surface features formed thereon. Typically, the desired surface features in each device area will include a plurality of contacts 209 and a die attach pad 207, as best illustrated in FIGS. 6(c) and 8. Tie bars 240 are also defined to support the desired surface features. The patterning may be done using any appropriate technology. Today, stamping and etching are the most common.

After the substrate panel 200 has been patterned, it may optionally be plated with a material 216, illustrated in FIG. 6(c), that facilitates better wire bonding as described below. In the described embodiment, the contact landings 209 are selectively silver plated since as is well known to those skilled in the art, the gold bonding wires bond better with the silver plating than a copper substrate. In other embodiments alternative materials such as palladium-nickel (PdNi) may be plated to onto the contact pads to facilitate bonding. Of course, the actual plating materials used may be widely varied and a number of suitable materials are commercially available.

Figure 6D:
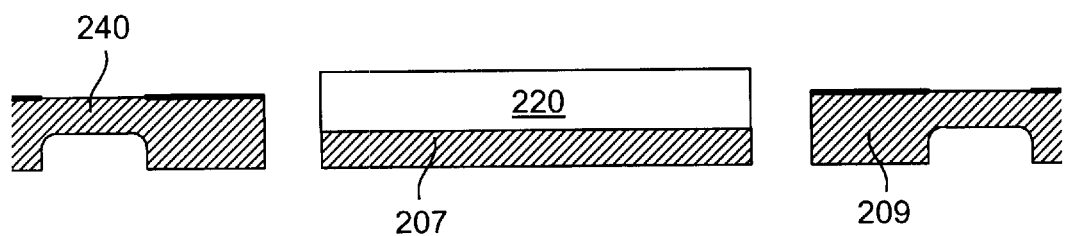
Figure 6E:
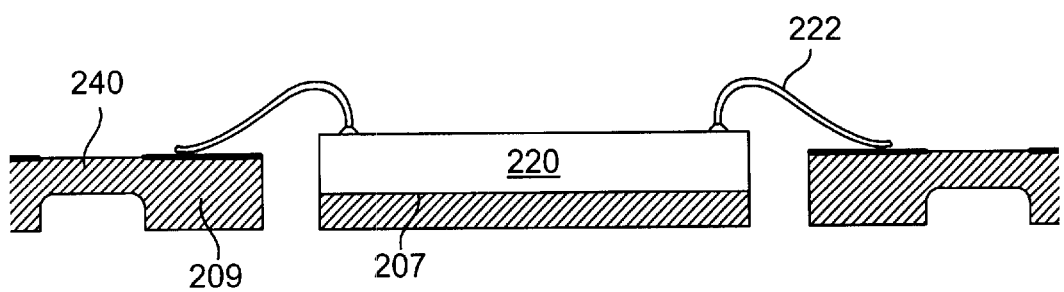

After any desired plating has been done, dice 220 are mounted on the die attach pads 207 using conventional die attachment techniques as illustrated in FIG. 6(d). Generally an adhesive or solder type material is used to secure the dice 220 to their respective die attach pads 207. Thereafter bond pads (not shown) on the dice 220 are electrically connected to associated ones of the contact landings 209. In the embodiment shown, wire bonding is used to electrically connect the dice to their associated contact landings. Thus, as illustrated in FIG. 6(e), bonding wires 222 electrically couple the dice 220 to the contact landings 209. As suggested above, bonding wires are typically formed from gold. When gold bonding wires 222 are used in combination with a copper substrate, it is advantageous to silver (or otherwise) plate to contact landings 209 to improve the adhesion of the bonding wires to the landings.

Figure 6F:
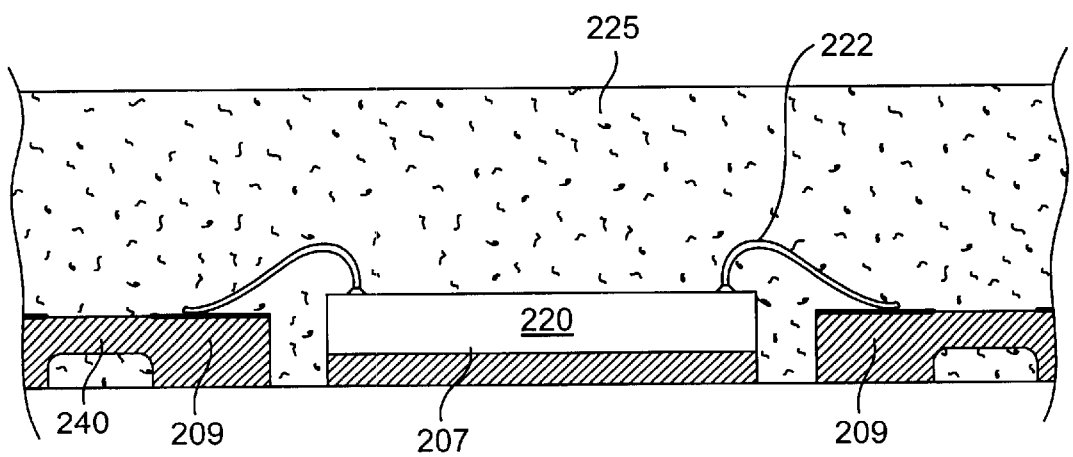

After all of the dice have been wire bonded or otherwise electrically connected to the appropriate contact landings, one or more plastic caps 225 are formed over the substrate panel 200 as illustrated in FIG. 6(f). The plastic caps 225 encapsulates the die 220 and bonding wires 222 and fill the gaps between the die attach pad 207 and the contacts 209 thereby serving to hold the contacts in place. It should be appreciated that during subsequent singulation, the tie bars 240 are cut and therefore the only materials holding the contacts 209 in place will be the molding material.

In the described embodiment, a separate plastic cap is formed over each separate array or matrix 202 of device areas 204. In the embodiment illustrated in FIG. 7, that would include four separate caps as outlined in dashed lines. However, it should be appreciated that a single cap or a different number of caps can readily be provided.

In some processes, we have found it helpful to adhere an adhesive tape (not shown) to the bottom surface of the substrate panel 200 during the assembly. This approach if more fully described in concurrently filed, co-pending application Ser. No. 09/528,539, which is incorporated herein by reference. The tape is typically adhered after the substrate has been patterned and helps support the contacts 209 and die attach pads 207 during the die attach and wire bonding operations. More importantly, the tape also helps prevents flash (i.e. unwanted plastic), from forming on the underside of the substrate panel 200 during the molding process.

As will be appreciated by those skilled in the art, one potential disadvantage to having a single very large cap 225 that covers a large array on a single large panel is that the cap may induce stresses which adversely affect the dice. Thus, when molding over large panels it is common to logically separate the panel into a plurality of regions (e.g. the separate arrays) in order to reduce the impact of such induced stresses. However, it should be apparent that when the component design parameters and molding process control permits, a single cap may be provided.

In other embodiments, a relatively larger number of caps 225 may be molded over the surface of the substrate panel. One drawback of having too many caps is that in order to form separate caps, a greater spacing is required between adjacent device areas 204 that are under different caps than would be required for adjacent device areas 204 under the same cap. Thus, the density of devices that can be packaged on a particular substrate panel is reduced.

The caps 225 may be formed using any conventional molding process including transfer molding and injection molding. In the described embodiment, a molded array type transfer molding process is used.

After the caps 225 have been formed, any additional process steps that are desired may be performed. As will be appreciated by those skilled in the art, these may include solder plating the exposed surfaces of the contacts 209 and singulating the packaged integrated circuits. The resulting packaged chips can then be surface mounted on printed circuit boards or other appropriate substrates and/or devices using conventional techniques.

Typically it is desirable to test the packaged integrated circuits after they have been packaged to make sure that the devices were not damaged during the packaging and that they work for their intended purposed. Conventionally, in leadless leadframe packaging (LLP), the dice must be singulated before testing since the tie bars 240 electrically connect the contacts when the leadframe based substrate strip is intact. Concurrently filed, co-pending application Ser. No. 09/528,658, which is incorporated herein by reference describes several processes which permit testing in panel form.

Although the foregoing invention has been described in some detail for purposes of clarity of understanding, it will be apparent that certain changes and modifications may be practiced within the scope of the appended claims. For example, the reverse wire bonding can be used in conjunction with any of the described embodiments. A number of conventional package processing techniques have been described as being used to accomplish specific steps in the formation of the described devices. It should be apparent that in most cases these processing techniques can be widely varied and a wide variety of alternative conventional processes may be used in their place. Accordingly, the present embodiments are to be considered as illustrative and not restrictive, and the invention is not to be limited to the details given herein, but may be modified within the scope and equivalents of the appended claims.

What is claimed is:

1. A semiconductor package comprising:
    an electrically conductive lead frame formed from a single conductive substrate, the lead frame having a plurality of contacts and a die attach pad, the lead frame having top and bottom surfaces, wherein the thickness of the die attach pad is thinner than at least a portion of the contacts;
    an integrated circuit die attached to the top surface of the die attach pad wherein the die overhangs beyond the die attach pad towards at least one of the contacts, the die having a plurality of bond pads thereon;
    a plurality of bonding wires that electrically couple the respective bond pads to the top surfaces of associated ones of the contacts; and
    a plastic cap that is molded over the integrated circuit die and the contacts thereby encapsulating the bonding wires, wherein encapsulation material that forms the cap mechanically supports the contacts and is exposed at a bottom surface of the lead frame and the bottom surface of the contacts remain exposed to facilitate electrical connection to external devices and the bottom surface of the die attach pad remains exposed, the cap substantially completely covering the top surface of the contacts and wherein the encapsulation material exposed at the bottom surface of the lead frame is substantially co-planar with the bottom surfaces of the contacts and die attach pad.

2. A semiconductor package as recited in claim 1 wherein a portion of selected one of the contacts are thinned to a thickness substantially similar to the die attach pad to form contact shelves and the die is mounted, bridging the die attach pad to the contact shelves.

3. A semiconductor package as recited in claim 1 wherein at least some of the bonding wires are ball bonded to the contacts.

4. A semiconductor package as recited in claim 1 wherein the die attach pad and contacts are formed from a copper substrate panel having a matrix of device areas thereon.

5. An apparatus that facilitates bulk packaging of a large number of integrated circuits, the apparatus comprising:
    an electrically conductive lead frame panel arranged in a two dimensional array of device areas defined thereon, each device area including an associated plurality of contacts and an associated die attach pad, the lead frame panel having top and bottom surfaces, wherein the thickness of the die attach pads are thinner than at least a portion of the contacts;
    a multiplicity of integrated circuit dice, each die being attached to the top surface of an associated one of the die attach pads, each die having a plurality of bond pads thereon, wherein at least some of the dice overhang beyond their associated die attach pads;
    a plurality of bonding wires that electrically couple respective bond pads to associated ones of the contacts, wherein the bonding wires have bonds that are coupled to the contacts at a position above the top surface of the die attach pad; and
    a plastic cap that is molded over a plurality of the integrated circuit dice and the contacts thereby encapsulating the bonding wires, wherein the cap is molded such that the bottom surface of the contacts remain exposed to facilitate electrical connection to external devices after singulation and the bottom surface of the die attach pad remains exposed, the cap substantially completely covering the top surface of the contacts.

6. An apparatus as recited in claim 5 wherein a portion of selected ones of the contacts are thinned to a thickness substantially similar to the die attach pads to form contact shelves and the dice are mounted to such that the dice bridge from their associated die attach pad to their associated contact shelves.

7. An apparatus as recited in claim 5 wherein at least some of the bonding wires are ball bonded to the contacts.

8. An apparatus as recited in claim 5 wherein the substrate panel is formed from copper.

9. An apparatus as recited in claim 5 wherein molding material that forms the cap is exposed along a bottom surface of the panel between the die attach pads and their respective contacts, wherein the bottom surfaces of the die attach pads, the molding material and the contacts are substantially co-planer.

10. A method of packaging integrated circuits comprising:

forming a plurality of recesses in an electrically conductive substrate panel;

patterning the substrate panel to define a plurality of die attach pads, the die attach pads being defined in the recesses, and to define a plurality of contacts wherein at least a portion of the contacts are not defined in the recesses, the patterning forming a lead frame panel from the substrate panel;

attaching dice to the die attach pads, wherein at least some of the dice overhang beyond their die attach pads respectively;

wire bonding the dice to the contacts;

forming a plastic cap over at least a plurality of the device areas in the lead frame panel to encapsulate the bonding wires, and to cover the dice and the contacts while leaving bottom surfaces of the dice and contacts exposed, wherein the plastic cap serves to hold the contacts in place relative to the die attach pad; and wherein molding material that forms the cap is exposed along a bottom surface of the lead frame panel between the die attach pads and their respective contacts such that the bottom surfaces of the die attach pads, the molding material and the contacts are substantially co-planer.

11. A semiconductor package comprising:

a lead frame having a plurality of contacts and a die attach pad, wherein the contacts have top and bottom surfaces, and the die attach pad has a top surface and a bottom surface, and wherein the thickness of the die attach pad is thinner than at least a portion of the contacts;

an integrated circuit die attached to the top surface of the die attach pad, the die having a plurality of bond pads thereon, the die at least partially overhanging the top surface of the die attach pad;

a plurality of bonding wires that electrically couple the respective bond pads to the top surfaces of associated ones of the contacts; and a plastic cap that is molded over the integrated circuit die and the contacts thereby encapsulating the bonding wires, wherein the cap is molded such that the bottom surface of the contacts remain exposed to facilitate electrical connection to external devices and the bottom surface of the die attach pad remains exposed and is coplanar with the bottom surface of the contacts, the cap substantially completely covering the top surface of the contacts.

* * * * *